United States Patent
Lin et al.

(10) Patent No.: US 9,601,430 B2
(45) Date of Patent: Mar. 21, 2017

(54) SEMICONDUCTOR DEVICE STRUCTURE AND METHOD FOR FORMING THE SAME

(71) Applicant: Taiwan Semiconductor Manufacturing Co., Ltd, Hsin-Chu (TW)

(72) Inventors: Rueijer Lin, Hsinchu (TW); Chen-Yuan Kao, Zhudong Township (TW); Chun-Chieh Lin, Taichung (TW); Huang-Yi Huang, Hsin-chu (TW)

(73) Assignee: TAIWAN SEMICONDUCTOR MANUFACTURING CO., LTD., Hsin-chu (TW)

( * ) Notice: Subject to any disclaimer, the term of this patent is extended or adjusted under 35 U.S.C. 154(b) by 0 days.

(21) Appl. No.: 14/504,805

(22) Filed: Oct. 2, 2014

(65) Prior Publication Data

US 2016/0099216 A1 Apr. 7, 2016

(51) Int. Cl.
*H01L 21/288* (2006.01)
*H01L 23/532* (2006.01)
*H01L 23/485* (2006.01)
*H01L 21/768* (2006.01)

(52) U.S. Cl.
CPC .. *H01L 23/53209* (2013.01); *H01L 21/76882* (2013.01); *H01L 23/485* (2013.01); *H01L 23/53266* (2013.01); *H01L 21/288* (2013.01); *H01L 21/2885* (2013.01); *H01L 21/76831* (2013.01); *H01L 2924/0002* (2013.01)

(58) Field of Classification Search
CPC ........... H01L 21/76846; H01L 23/5226; H01L 23/53209; H01L 23/5384; H01L 21/288; H01L 21/768; H01L 21/76882; H01L 23/485; H01L 23/528; H01L 23/532; H01L 23/53266
See application file for complete search history.

(56) References Cited

U.S. PATENT DOCUMENTS

| | | | |
|---|---|---|---|
| 6,194,315 B1 * | 2/2001 | Hu et al. | 438/683 |
| 8,796,853 B2 * | 8/2014 | Yang et al. | 257/751 |
| 2004/0266167 A1 * | 12/2004 | Dubin | H01L 21/7682 438/619 |
| 2010/0078818 A1 * | 4/2010 | Ishizaka et al. | 257/751 |
| 2010/0081271 A1 * | 4/2010 | Ishizaka | H01L 21/76831 438/622 |

(Continued)

*Primary Examiner* — Benjamin Sandvik
*Assistant Examiner* — Fazli Erdem
(74) *Attorney, Agent, or Firm* — Birch, Stewart, Kolasch & Birch, LLP

(57) ABSTRACT

A semiconductor device structure is provided. The semiconductor device structure includes a semiconductor substrate. The semiconductor device structure includes a dielectric layer positioned on the semiconductor substrate. The dielectric layer has a first recess. The semiconductor device structure includes a conductive structure filling the first recess. The conductive structure includes a first conductive layer and a second conductive layer. The first conductive layer is positioned over an inner wall and a bottom of the first recess. The first conductive layer has a second recess in the first recess. The second conductive layer fills the second recess. The first conductive layer and the second conductive layer include cobalt. The second conductive layer further includes at least one of sulfur, chlorine, boron, phosphorus, or nitrogen.

20 Claims, 15 Drawing Sheets

(56) References Cited

U.S. PATENT DOCUMENTS

| | | |
|---|---|---|
| 2012/0161320 A1* | 6/2012 | Akolkar et al. ............... 257/751 |
| 2012/0252207 A1* | 10/2012 | Lei et al. ...................... 438/653 |
| 2013/0285244 A1 | 10/2013 | Lin et al. |
| 2014/0183738 A1* | 7/2014 | Jezewski et al. ............. 257/751 |
| 2014/0210085 A1 | 7/2014 | Wang et al. |
| 2014/0264920 A1* | 9/2014 | Yang et al. ................... 257/774 |
| 2014/0299988 A1* | 10/2014 | Cabral et al. ................. 257/751 |
| 2015/0093891 A1* | 4/2015 | Zope et al. .................... 438/618 |
| 2015/0147880 A1* | 5/2015 | Lee et al. ...................... 438/660 |
| 2015/0170964 A1* | 6/2015 | Chen et al. ........ H01L 21/76883 |
| 2015/0179579 A1* | 6/2015 | Jezewski et al. . H01L 23/53209 |
| 2015/0270133 A1* | 9/2015 | Lam ................... H01L 21/2885 205/157 |
| 2016/0056074 A1* | 2/2016 | Na .................... H01L 21/76876 438/666 |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
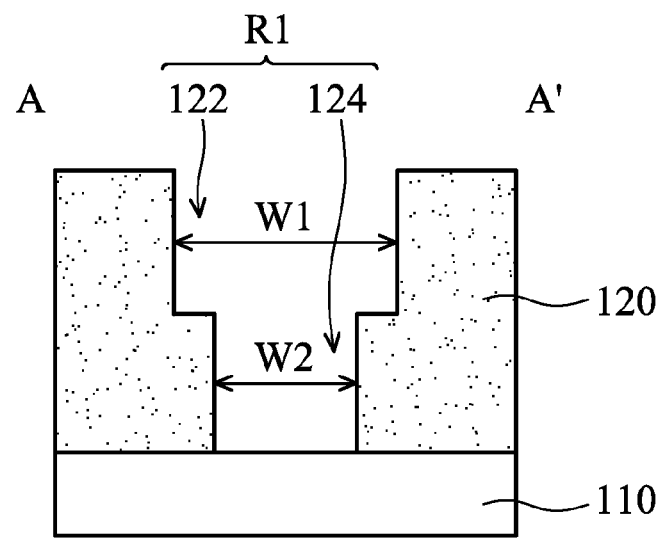
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1G are cross-sectional views of various stages of a process for forming a semiconductor device structure 100, in accordance with some embodiments. FIG. 2 is a top view of the structure of FIG. 1A, in accordance with some embodiments. FIG. 1A is a cross-sectional view illustrating the structure along a sectional line A-A' in FIG. 2, in accordance with some embodiments.

As shown in FIGS. 1A and 2, a semiconductor substrate 110 is provided, in accordance with some embodiments. The semiconductor substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

The semiconductor substrate 110 may further include a device region. The device region may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), or the like.

Various processes are performed to form the device elements, such as deposition, etching, implantation, photolithography, annealing, and/or other applicable processes. In some embodiments, the device region is formed in the semiconductor substrate 110 in a back-end-of-line (BEOL) process.

As shown in FIGS. 1A and 2, a dielectric layer 120 is formed over the semiconductor substrate 110, in accordance with some embodiments. The dielectric layer 120 is an inter-metal dielectric (IMD) layer, in accordance with some embodiments. The dielectric layer 120 may include multi-layers made of multiple dielectric materials, such as a low dielectric constant or an extreme low dielectric constant (ELK) material.

Examples of the dielectric materials may include, but are not limited to, oxide (such as $SiO_2$), borophosphosilicate glass (BPSG), tetraethyl orthosilicate (TEOS), spin on glass (SOG), undoped silicate glass (USG), fluorinated silicate glass (FSG), high-density plasma (HDP) oxide, or plasma-enhanced TEOS (PETEOS). The dielectric layer 120 may be formed by chemical vapor deposition (CVD), physical vapor deposition (PVD), atomic layer deposition (ALD), spin-on coating, or another applicable process.

As shown in FIGS. 1A and 2, a trench 122 and a via hole 124 are formed in the dielectric layer 120, in accordance with some embodiments. The via hole 124 is under the trench 122 and connects with the trench 122, in accordance with some embodiments. The via hole 124 and the trench 122 together form a recess R1, in accordance with some embodiments. The trench 122 has a width W1 ranging from about 5 nm to about 100 nm, in accordance with some embodiments. The via hole 124 has a width W2 ranging from about 5 nm to about 100 nm, in accordance with some embodiments. The width W2 may less than or equal to the width W1. The via hole 124 exposes a portion of the semiconductor substrate 110, in accordance with some embodiments. The trench 122 and the via hole 124 are formed by photolithography processes and etching processes, in accordance with some embodiments.

Figure 1B:
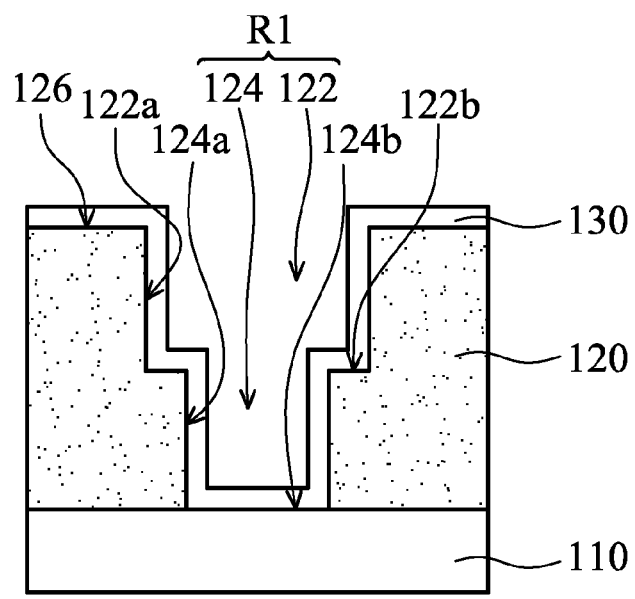
Figure 2:
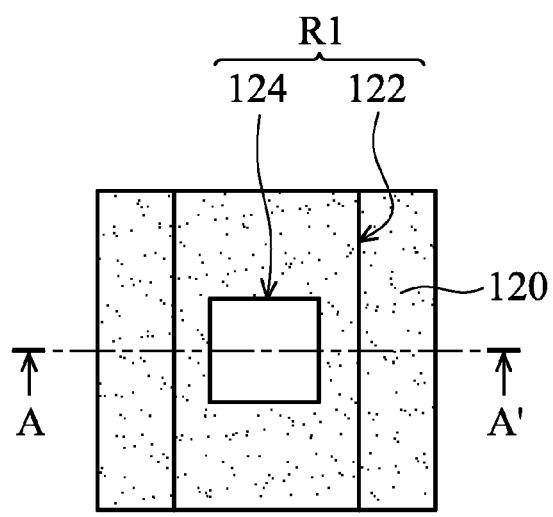
FIG. 2 is a top view of the structure of FIG. 1A, in accordance with some embodiments.

As shown in FIG. 1B, a barrier layer 130 is formed in the recess R1, in accordance with some embodiments. In some embodiments, the barrier layer 130 is formed over an inner wall 122a and a bottom 122b of the trench 122 and an inner wall 124a and a bottom 124b of the via hole 124. The barrier layer 130 is further formed over a top surface 126 of the dielectric layer 120, in accordance with some embodiments. The barrier layer 130 is configured to prevent metal materials formed subsequently from diffusing into the dielectric layer 120, in accordance with some embodiments. In some other embodiments, the barrier layer 130 is not formed.

The barrier layer 130 includes nitride (e.g., titanium nitride) or metal (e.g., titanium, tantalum, cobalt, or ruthenium), in accordance with some embodiments. The barrier layer 130 is formed by a physical vapor deposition process or a chemical vapor deposition process, in accordance with some embodiments.

Figure 1C:
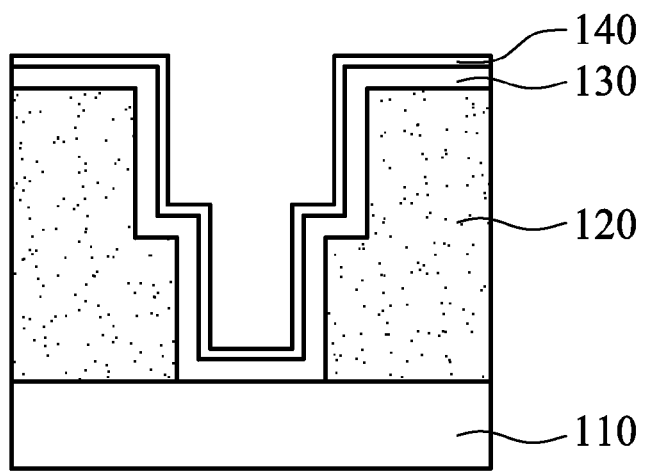

As shown in FIG. 1C, a seed layer 140 is formed over the barrier layer 130, in accordance with some embodiments. The seed layer 140 is configured to facilitate the subsequent formation of a conductive layer, in accordance with some embodiments. The seed layer 140 includes cobalt or another suitable conductive material. The seed layer 140 is formed by a physical vapor deposition process, in accordance with some embodiments. In some other embodiments, the seed layer 140 is not formed.

Figure 1D:
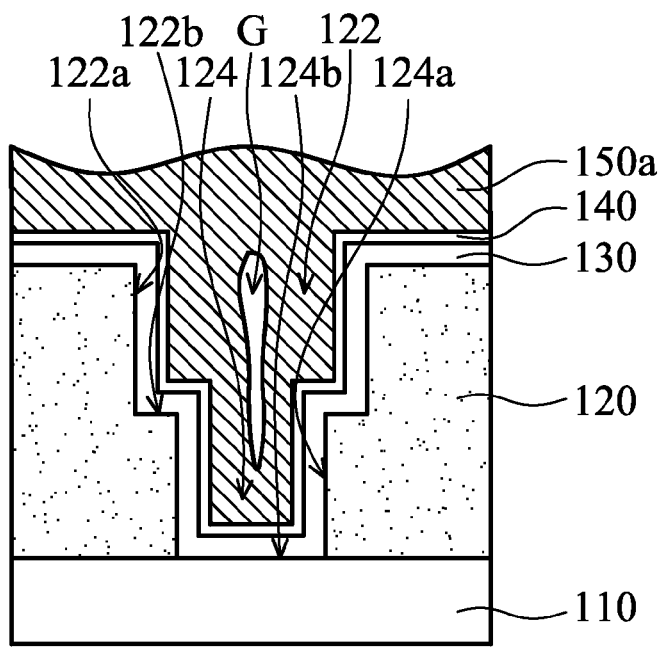

As shown in FIG. 1D, a first conductive material layer 150a is formed over the seed layer 140, in accordance with some embodiments. In some embodiments, the first conductive material layer 150a is formed over the inner wall 122a and the bottom 122b of the trench 122 and the inner wall 124a and the bottom 124b of the via hole 124.

The first conductive material layer 150a includes cobalt or another suitable conductive material. The first conductive material layer 150a is formed by a chemical vapor deposition process, in accordance with some embodiments. In some embodiments, there is a void G formed in the first conductive material layer 150a.

Figure 1E:
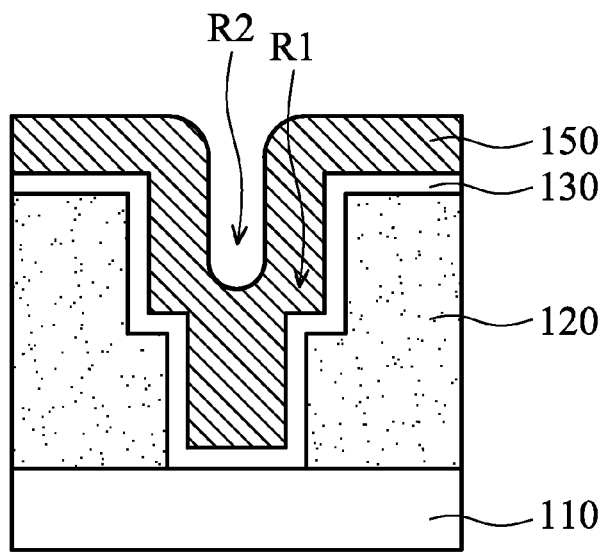

As shown in FIG. 1E, a reflow process is performed to convert the first conductive material layer 150a into a first conductive layer 150, in accordance with some embodiments. The reflow process melts the first conductive material layer 150a so as to eliminate the void G. Therefore, the first conductive layer 150 has no voids, in accordance with some embodiments. The first conductive layer 150 has a recess R2 in the recess R1, in accordance with some embodiments.

In some embodiments, the reflow process further melts the seed layer 140. Therefore, the melted seed layer 140 is mixed with the melted first conductive material layer 150a to form the first conductive layer 150, in accordance with some embodiments. The barrier layer 130 is positioned between the first conductive layer 150 and the dielectric layer 120, in accordance with some embodiments. In some other embodiments (not shown), the reflow process does not melt the seed layer 140.

Figure 1F:
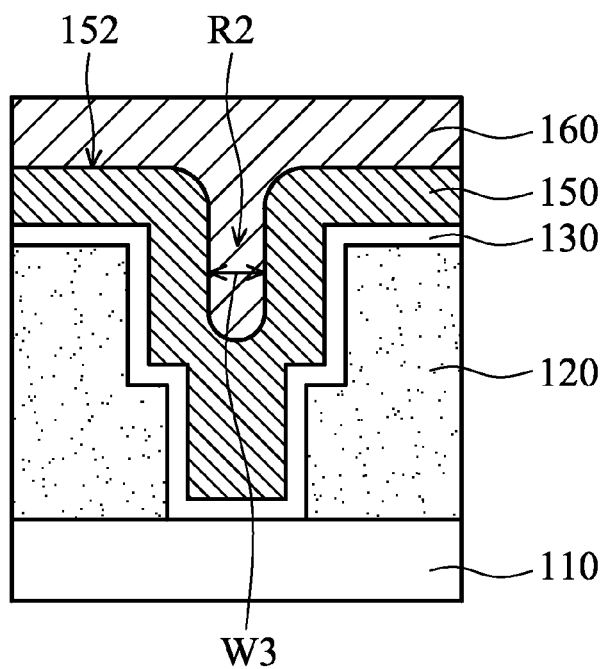

As shown in FIG. 1F, a second conductive layer 160 is formed in the recess R2, in accordance with some embodiments. The second conductive layer 160 is formed by an electroplating process or an electroless plating process, in accordance with some embodiments. The second conductive layer 160, which is formed by the electroplating process or the electroless plating process, grows from a surface 152 of the first conductive layer 150, in accordance with some embodiments. Therefore, the second conductive layer 160 may fill the recess R2 as long as the electrolyte used in the plating process is able to flow into the recess R2.

As a result, the second conductive layer 160 may fill the recess R2 with a small width W3. The width W3 is in a range from about 1 nm to about 50 nm, in accordance with some embodiments. The second conductive layer 160 includes cobalt or another suitable conductive material.

In some embodiments, the first conductive layer 150 and the second conductive layer 160 include the same material (e.g., cobalt). In some embodiments, the first conductive layer 150 includes about 50 to about 97 atomic percent of cobalt. In some embodiments, the second conductive layer 160 includes about 50 to about 97 atomic percent of cobalt. In some embodiments, the second conductive layer 160 includes carbon and/or oxygen. The second conductive layer 160 includes about 0.1 to about 2 atomic percent of carbon and/or oxygen, in accordance with some embodiments.

In some embodiments, reducing agents used in the electroless plating process include hydrophosphite ($H_2PO_2^-$) and borane dimethylamine complex ($(CH_3)_2NH{:}BH_3$). In some embodiments, by-products formed in the electroless plating process include hydrogen phosphite ($HPO_3^{2-}$) and boric acid ($B(OH)_3$). Therefore, compared to the first conductive layer 150, the second conductive layer 160 formed by the electroless plating process further includes boron, phosphorus, and/or nitrogen. In some embodiments, the second conductive layer 160 includes about 0.00001 to about 1 atomic percent of boron, phosphorus, and/or nitrogen.

In some embodiments, an electrolyte used in the electroplating process includes at least one of cobalt ions, chlorine ions, a boric acid, sulfate, nitrate ions, an acetic acid, or a phosphoric acid. Therefore, compared to the first conductive layer 150, the second conductive layer 160 formed by the electroplating process further includes sulfur, chlorine, boron, phosphorus, and/or nitrogen. The second conductive layer 160 includes about 0.00001 to about 1 atomic percent of sulfur, chlorine, boron, phosphorus, and/or nitrogen, in accordance with some embodiments.

Figure 1G:
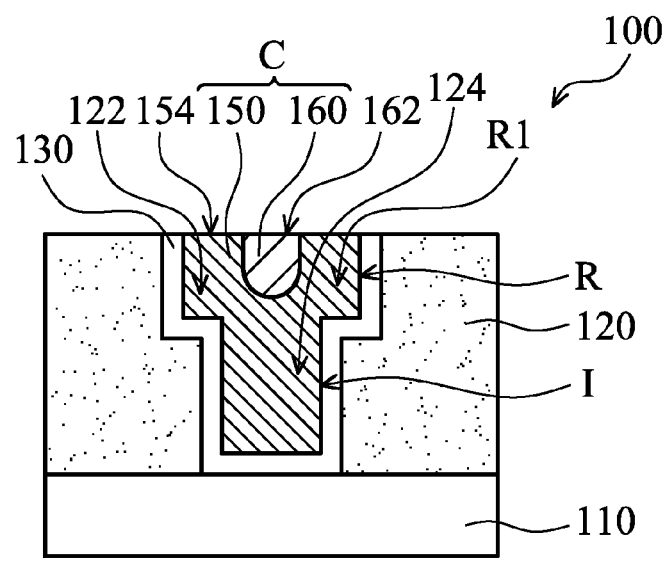

As shown in FIG. 1G, portions of the barrier layer 130, the first conductive layer 150, and the second conductive layer 160 outside of the recess R1 are removed, in accordance with some embodiments. The removal process includes a planarization process (e.g., a chemical mechanical polishing process), in accordance with some embodiments.

After the planarization process, a top surface 162 of the second conductive layer 160 is substantially aligned with a top surface 154 of the first conductive layer 150, in accordance with some embodiments. In some embodiments, the second conductive layer 160 is above the via hole 124. The second conductive layer 160 and the first conductive layer 150 together form a conductive structure C, in accordance with some embodiments. The first recess R1 is filled with the conductive structure C, in accordance with some embodiments. In some embodiments, the conductive structure C includes about 50 to about 97 atomic percent of cobalt.

The portion of the conductive structure C formed in the trench 122 includes a conductive wire R, in accordance with some embodiments. The portion of the conductive structure C formed in the via hole 124 includes an interconnect structure I, in accordance with some embodiments. The interconnect structure I electrically connects the conductive wire R to another conductive wire (not shown) or a device element (not shown) formed in/over the semiconductor substrate 110, in accordance with some embodiments.

The method for forming the conductive structure C may also be used to form an interconnect structure or a conductive wire individually. The embodiments for forming the interconnect structure and the conductive wire individually are described as follows.

Figure 3A:
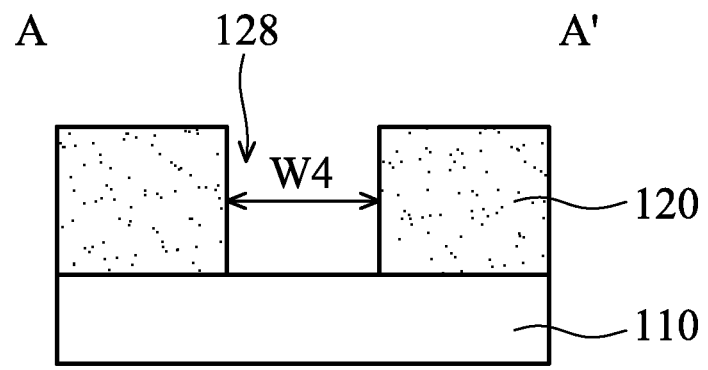
FIGS. 3A-3G are cross-sectional views of various stages of a process for forming a semiconductor device structure, in accordance with some embodiments.

FIGS. 3A-3G are cross-sectional views of various stages of a process for forming a semiconductor device structure 300, in accordance with some embodiments. FIG. 4 is a top view of the structure of FIG. 3A, in accordance with some embodiments. FIG. 3A is a cross-sectional view illustrating the structure along a sectional line A-A' in FIG. 4, in accordance with some embodiments.

As shown in FIGS. 3A and 4, a semiconductor substrate 110 is provided, in accordance with some embodiments. As shown in FIGS. 3A and 4, a dielectric layer 120 is formed over the semiconductor substrate 110, in accordance with some embodiments. Thereafter, a via hole 128 is formed in the dielectric layer 120, in accordance with some embodiments. The via hole 128 may be also referred to as a recess.

The via hole 128 passes through the dielectric layer 120 and exposes a portion of the semiconductor substrate 110, in accordance with some embodiments. The via hole 128 has a width W4 ranging from about 5 nm to about 100 nm, in accordance with some embodiments. The via hole 128 is formed by a photolithography process and an etching process, in accordance with some embodiments.

Figure 3B:
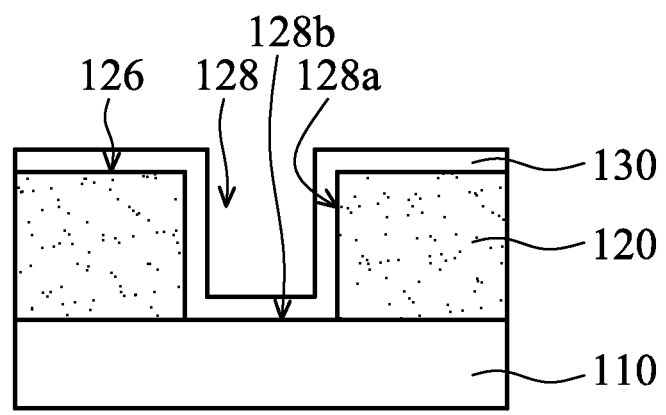
Figure 4:
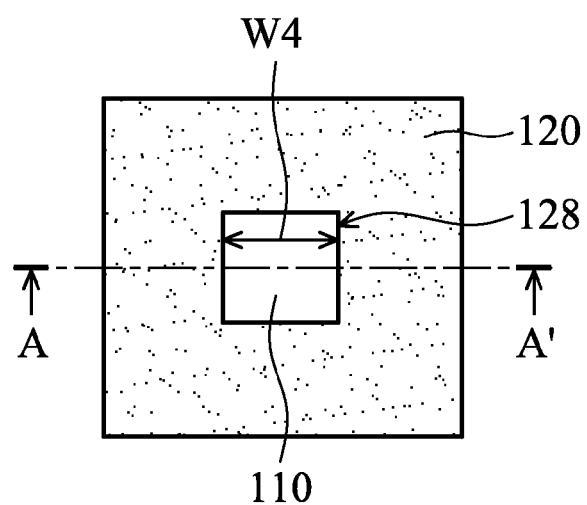
FIG. 4 is a top view of the structure of FIG. 3A, in accordance with some embodiments.

As shown in FIG. 3B, a barrier layer 130 is formed in the via hole 128, in accordance with some embodiments. The barrier layer 130 is formed over an inner wall 128a and a bottom 128b of the via hole 128, in accordance with some embodiments. In some embodiments, the barrier layer 130 is further formed over a top surface 126 of the dielectric layer 120.

Figure 3C:
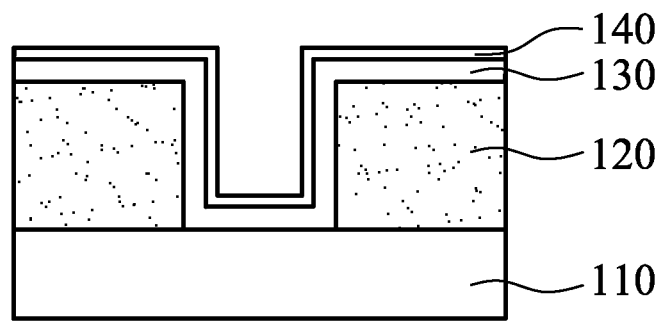
Figure 3D:
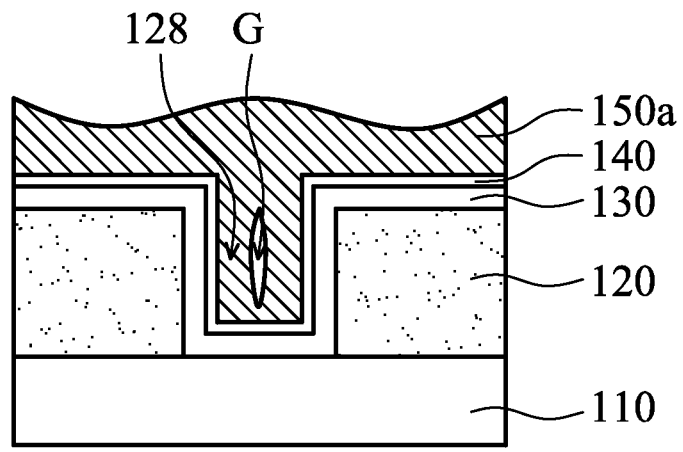

As shown in FIG. 3C, a seed layer 140 is formed over the barrier layer 130, in accordance with some embodiments. As shown in FIG. 3D, a first conductive material layer 150a is formed over the seed layer 140, in accordance with some embodiments. In some embodiments, there is a void G formed in the first conductive material layer 150a. The void G is positioned in the via hole 128, in accordance with some embodiments.

Figure 3E:
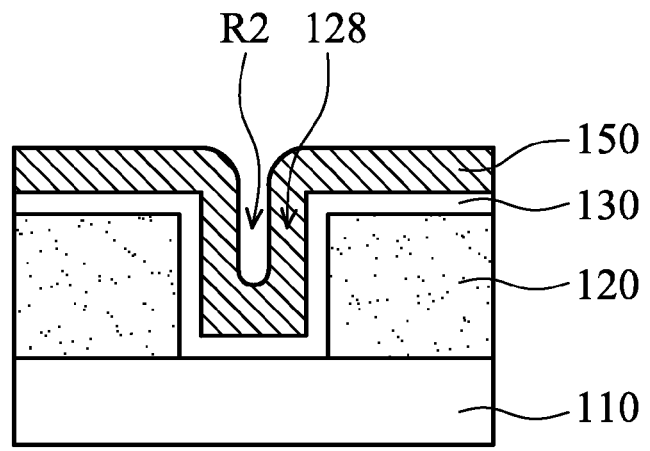

As shown in FIG. 3E, a reflow process is performed to convert the first conductive material layer 150a into a first conductive layer 150, in accordance with some embodiments. The first conductive layer 150 has a recess R2 in the via hole 128, in accordance with some embodiments.

In some embodiments, the reflow process further melts the seed layer 140. Therefore, the melted seed layer 140 is mixed with the melted first conductive material layer 150a to form the first conductive layer 150, in accordance with some embodiments. In some other embodiments (not shown), the reflow process does not melt the seed layer 140.

Figure 3F:
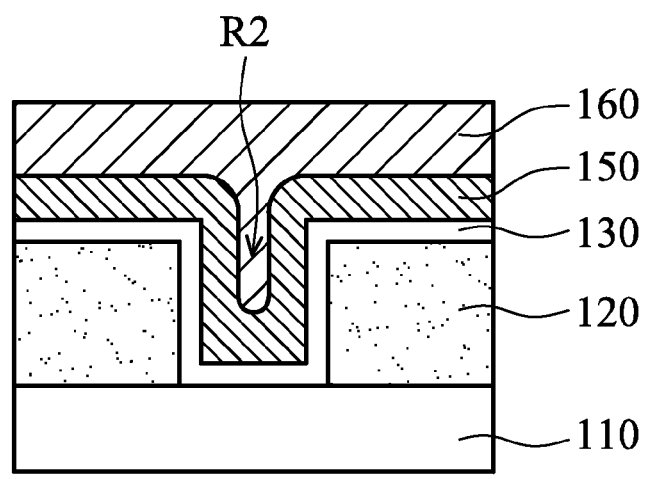

As shown in FIG. 3F, a second conductive layer 160 is formed in the recess R2, in accordance with some embodiments. The second conductive layer 160 is formed by an electroplating process or an electroless plating process. The second conductive layer 160 fills the recess R2, in accordance with some embodiments. In some embodiments, the first conductive layer 150 and the second conductive layer 160 include the same material (e.g., cobalt).

Figure 3G:
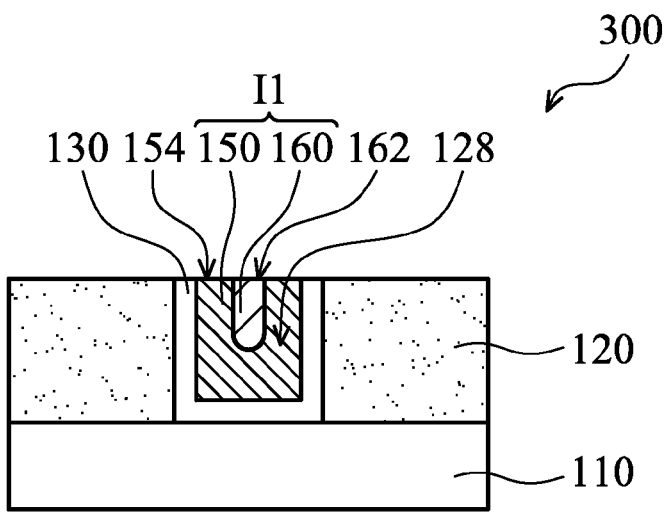

As shown in FIG. 3G, portions of the barrier layer 130, the first conductive layer 150, and the second conductive layer 160 outside of the via hole 128 are removed, in accordance with some embodiments. The removal process includes a planarization process (e.g., a chemical mechanical polishing process), in accordance with some embodiments.

After the planarization process, a top surface 162 of the second conductive layer 160 is substantially aligned with a top surface 154 of the first conductive layer 150, in accordance with some embodiments. The second conductive layer 160 and the first conductive layer 150 together form an interconnect structure I1, in accordance with some embodiments. The interconnect structure I1 is electrically connected with a conductive wire (not shown) or a device element (not shown) formed in/over the semiconductor substrate 110, in accordance with some embodiments.

Figure 5A:
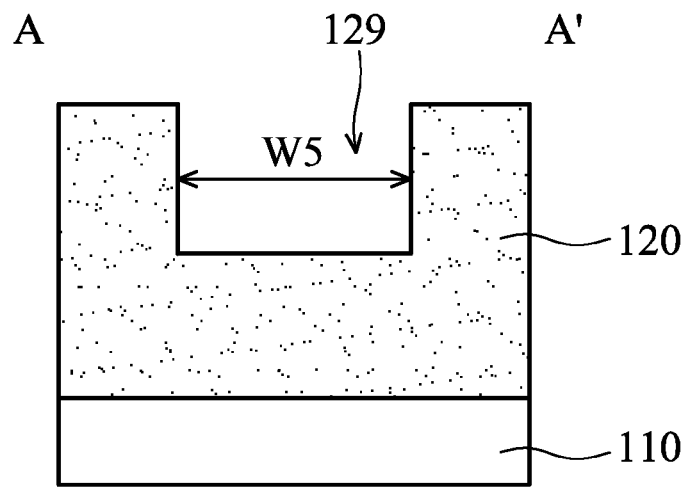
FIGS. 5A-5G are cross-sectional views of various stages of a process for forming a semiconductor device structure, in accordance with some embodiments.

FIGS. 5A-5G are cross-sectional views of various stages of a process for forming a semiconductor device structure 500, in accordance with some embodiments. FIG. 6 is a top view of the structure of FIG. 5A, in accordance with some embodiments. FIG. 5A is a cross-sectional view illustrating the structure along sectional line A-A' in FIG. 6, in accordance with some embodiments.

As shown in FIGS. 5A and 6, a semiconductor substrate 110 is provided, in accordance with some embodiments. As shown in FIGS. 5A and 6, a dielectric layer 120 is formed over the semiconductor substrate 110, in accordance with some embodiments. Thereafter, a trench 129 is formed in the dielectric layer 120, in accordance with some embodiments. The trench 129 may be also referred to as a recess. The trench 129 has a width W5 ranging from about 5 nm to about 100 nm, in accordance with some embodiments. The trench 129 is formed by a photolithography process and an etching process, in accordance with some embodiments.

Figure 5B:
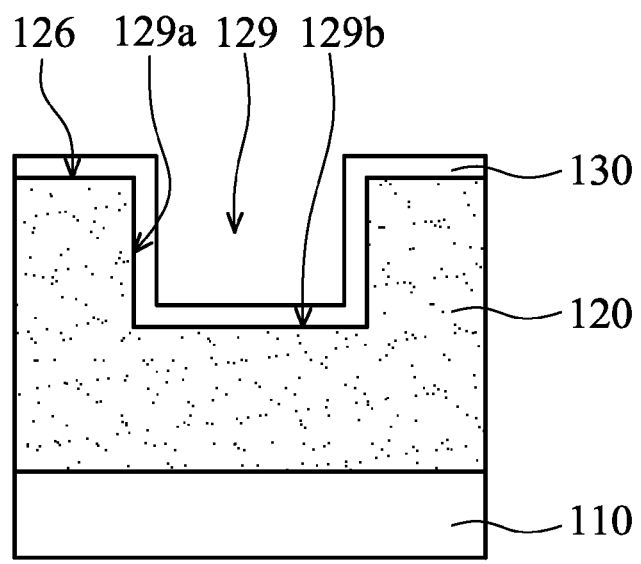
Figure 6:
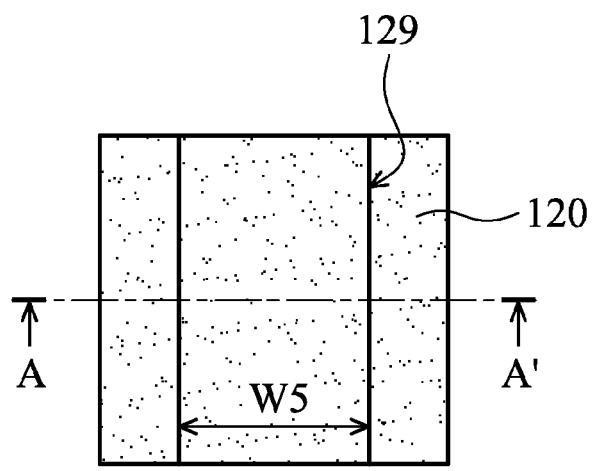
FIG. 6 is a top view of the structure of FIG. 5A, in accordance with some embodiments.

As shown in FIG. 5B, a barrier layer 130 is formed in the trench 129, in accordance with some embodiments. The barrier layer 130 is formed over an inner wall 129a and a bottom 129b of the trench 129, in accordance with some embodiments. In some embodiments, the barrier layer 130 is further formed over a top surface 126 of the dielectric layer 120.

Figure 5C:
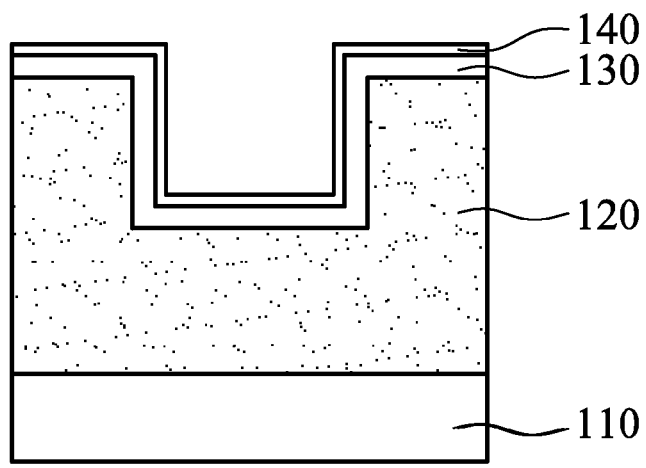
Figure 5D:
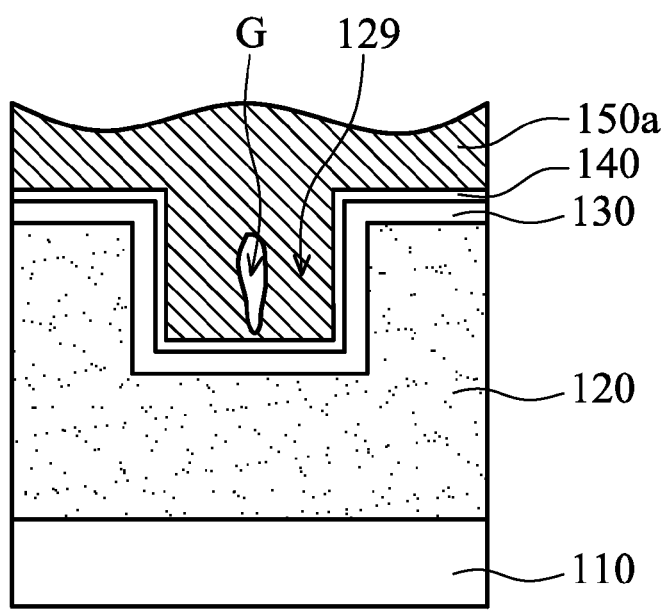

As shown in FIG. 5C, a seed layer 140 is formed over the barrier layer 130, in accordance with some embodiments. As shown in FIG. 5D, a first conductive material layer 150a is formed over the seed layer 140, in accordance with some embodiments. In some embodiments, there is a void G formed in the first conductive material layer 150a. The void G is positioned in the trench 129, in accordance with some embodiments.

Figure 5E:
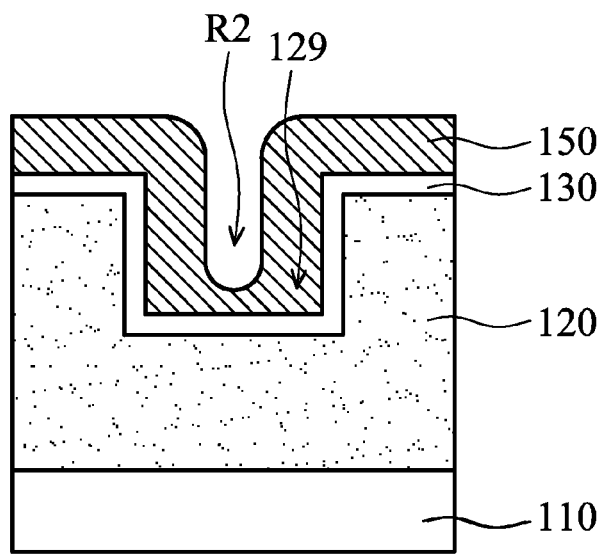

As shown in FIG. 5E, a reflow process is performed to convert the first conductive material layer 150a into a first conductive layer 150, in accordance with some embodiments. The first conductive layer 150 has a recess R2 in the trench 129, in accordance with some embodiments.

In some embodiments, the reflow process further melts the seed layer 140. Therefore, the melted seed layer 140 is mixed with the melted first conductive material layer 150*a* to form the first conductive layer 150, in accordance with some embodiments. In some other embodiments (not shown), the reflow process does not melt the seed layer 140.

Figure 5F:
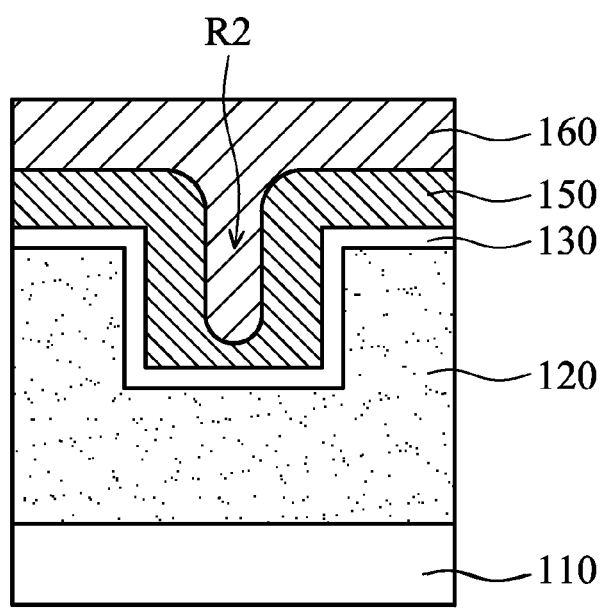

As shown in FIG. 5F, a second conductive layer 160 is formed in the recess R2, in accordance with some embodiments. The second conductive layer 160 is formed by an electroplating process or an electroless plating process. The second conductive layer 160 fills the recess R2, in accordance with some embodiments. In some embodiments, the first conductive layer 150 and the second conductive layer 160 include the same material (e.g., cobalt).

Figure 5G:
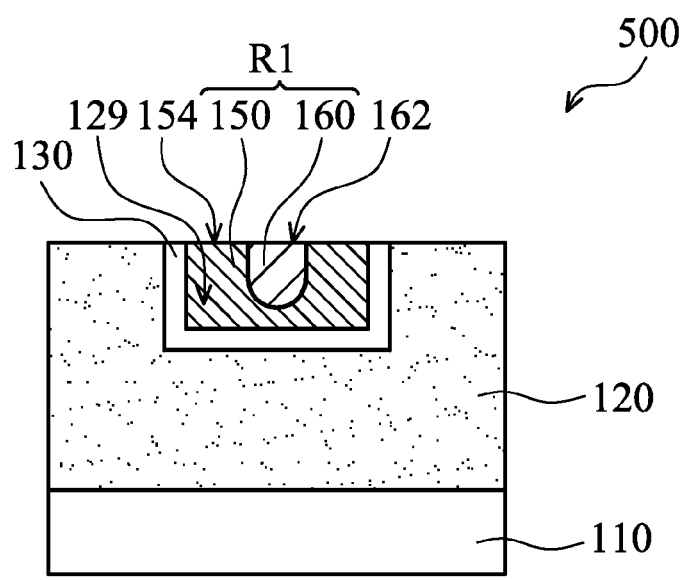

As shown in FIG. 5G, portions of the barrier layer 130, the first conductive layer 150, and the second conductive layer 160 outside of the trench 129 are removed, in accordance with some embodiments. The removal process includes a planarization process (e.g., a chemical mechanical polishing process), in accordance with some embodiments.

After the planarization process, a top surface 162 of the second conductive layer 160 is substantially aligned with a top surface 154 of the first conductive layer 150, in accordance with some embodiments. The second conductive layer 160 and the first conductive layer 150 together form a conductive wire R1, in accordance with some embodiments.

Figure 7A:
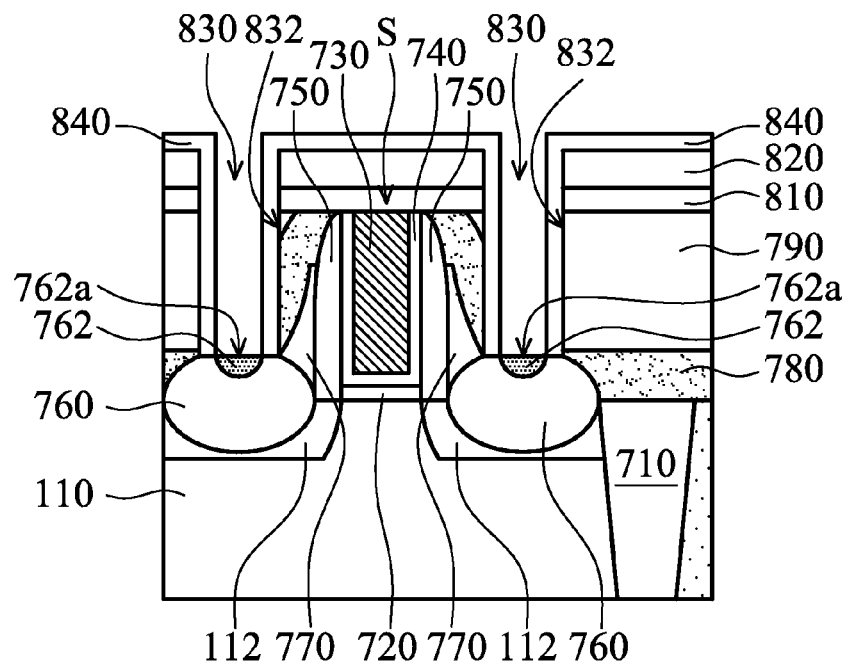
FIGS. 7A-7F are cross-sectional views of various stages of a process for forming a semiconductor device structure, in accordance with some embodiments.

FIGS. 7A-7F are cross-sectional views of various stages of a process for forming a semiconductor device structure 700, in accordance with some embodiments. As shown in FIG. 7A, a semiconductor substrate 110 is provided, in accordance with some embodiments.

An isolation structure 710 is formed in the semiconductor substrate 100 to define various active regions in the semiconductor substrate 100, and to electrically isolate neighboring devices (e.g. transistors) from one another. The isolation structure 710 may be made of a dielectric material, such as silicon oxide, silicon nitride, silicon oxynitride, fluoride-doped silicate glass (FSG), a low-K dielectric material, other suitable materials, or combinations thereof. The isolation structure 710 may be formed by using an isolation technology, such as local oxidation of semiconductor (LOCOS), shallow trench isolation (STI), or the like.

In some embodiments, the formation of the isolation structure 710 includes patterning the semiconductor substrate 100 by a photolithography process, etching a trench in the semiconductor substrate 100 (for example, by using a dry etching, wet etching, plasma etching process, or a combination thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 7A, a gate dielectric layer 720 and a gate electrode 730 are formed over the semiconductor substrate 100. The gate dielectric layer 720 may be made of a dielectric material, such as a high dielectric constant (high-k) material. The high-k material may be made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof. The gate dielectric layer 720 may be formed by an atomic layer deposition (ALD) process, a chemical vapor deposition (CVD) process, or other suitable processes.

The gate electrode 730 (also called a metal gate electrode) is formed by a gate-last approach or a replacement-gate (RPG) approach. The gate electrode 730 may be made of a suitable metal material, such as aluminum, tungsten, gold, platinum, cobalt, another suitable metal, an alloy thereof, or a combination thereof. The gate electrode 730 may be formed by using a PVD process, CVD process, plating process, or the like, or a combination thereof.

As shown in FIG. 7A, the gate electrode 730 is formed between the spacers 750, which have been previously formed. The spacers 750 may be made of a dielectric material, such as silicon nitride layer, silicon oxynitride layer, or combinations thereof. The structure of the spacers 750 shown in FIG. 7A is merely an example. Other configurations of the spacers 750 are also possible. For example, a sealing layer (not shown) is formed between the spacers 750 and the gate electrode 730.

In some embodiments, a work function metal layer 740 is formed between the spacers 750 and the gate electrode 730 and between the gate electrode 730 and the gate dielectric layer 720. The work function metal layer 740 provides desired work function for transistors to enhance device performance including improved threshold voltage. In the embodiments of forming an NMOS transistor, the work function metal layer 740 can be an n-type metal. The n-type metal may be made of tantalum, tantalum nitride, or combinations thereof.

On the other hand, in the embodiments of forming a PMOS transistor, the work function metal layer 740 can be a p-type metal. The p-type metal may be made of titanium, titanium nitride, other suitable materials, or combinations thereof.

The work function metal layer 740 may also be made of hafnium, zirconium, titanium, tantalum, aluminum, metal carbides (e.g., hafnium carbide, or zirconium carbide), aluminides, ruthenium or combinations thereof. The work function metal layer 740 may be formed by using a PVD process, CVD process, ALD process, plating process, another suitable method, or combinations thereof.

Doped regions 112 may be formed in the semiconductor substrate 100 using a suitable process, such as an ion implantation process. The doped regions 112 may be a heavily doped source region and a heavily doped drain region.

Stressors 760 may be formed in the doped regions 112 by using suitable processes. The suitable processes include, for example, an etching process for removing a portion of the semiconductor substrate 100 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

Spacer oxide layers 770 may be formed over the spacers 750 and the stressors 760 by using, for example, a chemical vapor deposition process. The spacer oxide layers 770 may fill the gaps between the spacers 750 and the stressors 760 to facilitate films subsequently formed to cover the spacers 750 and the stressors 760 smoothly. However, in some embodiments, the spacer oxide layers 770 are optional.

A contact etch stop layer 780 is formed over the semiconductor substrate 100 and sidewalls of the spacers 750, in accordance with some embodiments. The contact etch stop layer 780 may be made of a dielectric material, such as silicon nitride. The contact etch stop layer 780 may be conformally formed on the sidewalls of the spacers 750, the sidewalls of the spacer oxide layers 770, and the semiconductor substrate 100. However, in some embodiments, the contact etch stop layer 780 is not needed.

As shown in FIG. 7A, a dielectric layer 790 is then deposited over the semiconductor substrate 100, in accordance with some embodiments. The gate electrode 730, the work function metal layer 740, and the gate dielectric layer 720 together form a gate stack S (i.e., a metal gate stack), which is embedded the dielectric layer 790. The gate stack S is positioned between the doped regions 112, in accordance with some embodiments.

The dielectric layer 790 may be made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof. The dielectric layer 790 may be deposited by any suitable process, such as a CVD process, HDPCVD process, spin-on process, sputtering process, or combinations thereof.

A stop layer 810 (also called an insulating layer or a dielectric layer) is deposited over the dielectric layer 790, the contact etch stop layer 780, the work function metal layer 740, and the gate electrode 730, in accordance with some embodiments. The stop layer 810 may be made of silicon nitride or other suitable materials.

A protective layer 820 is formed on the stop layer 810 to protect the stop layer 810 from being damaged during subsequent processes, such as a pre-amorphized implantation (PAI) process, in accordance with some embodiments. The protective layer 820 is made of, for example, a plasma-enhanced oxide (PEOX) layer.

As shown in FIG. 7A, contact openings 830 pass through the protective layer 820, the stop layer 810, the dielectric layer 790, and the contact etch stop layer 780, in accordance with some embodiments. Therefore, the contact openings 830 expose portions of the stressors 760, in accordance with some embodiments.

As shown in FIG. 7A, a dielectric spacer liner (DSL) layer 840 is conformally formed on the protective layer 820 and sidewalls 832 of the contact openings 830, in accordance with some embodiments. The DSL layer 840 may be made of SiOC or other suitable materials. The DSL layer 840 is formed by, for example, an atomic layer deposition process and an etching process.

As shown in FIG. 7A, metal silicide regions 762 are formed in the stressors 760, in accordance with some embodiments. The material of the metal silicide regions 762 may include nickel silicide. In some embodiments, the metal silicide regions 762 are made of a silicide material of a suitable metal material. The suitable metal material may include cobalt (Co), nickel (Ni), platinum (Pt), titanium (Ti), ytterbium (Yb), molybdenum (Mo), erbium (Er), or combinations thereof. The top surfaces 762a of the metal silicide regions 762 are exposed by the contact openings 830, in accordance with some embodiments.

Figure 7B:
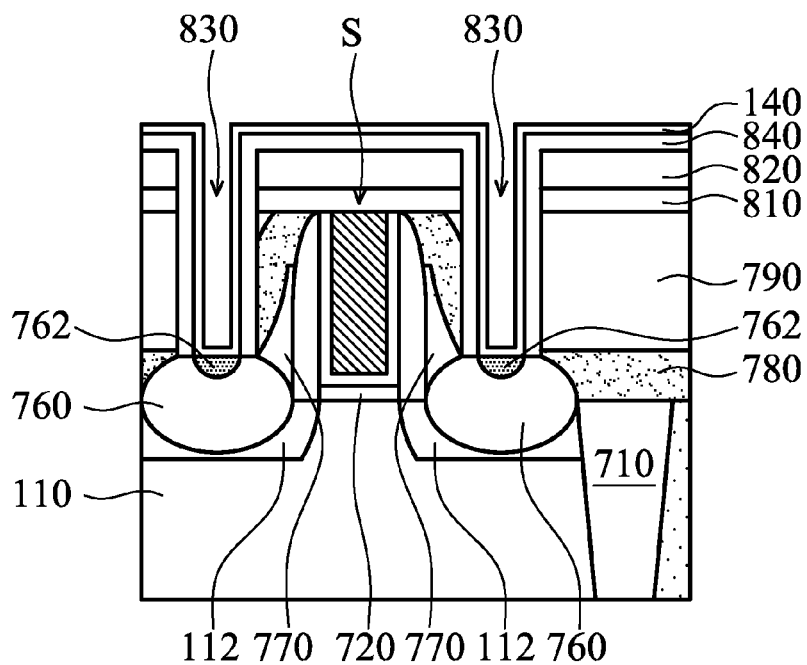
Figure 7C:
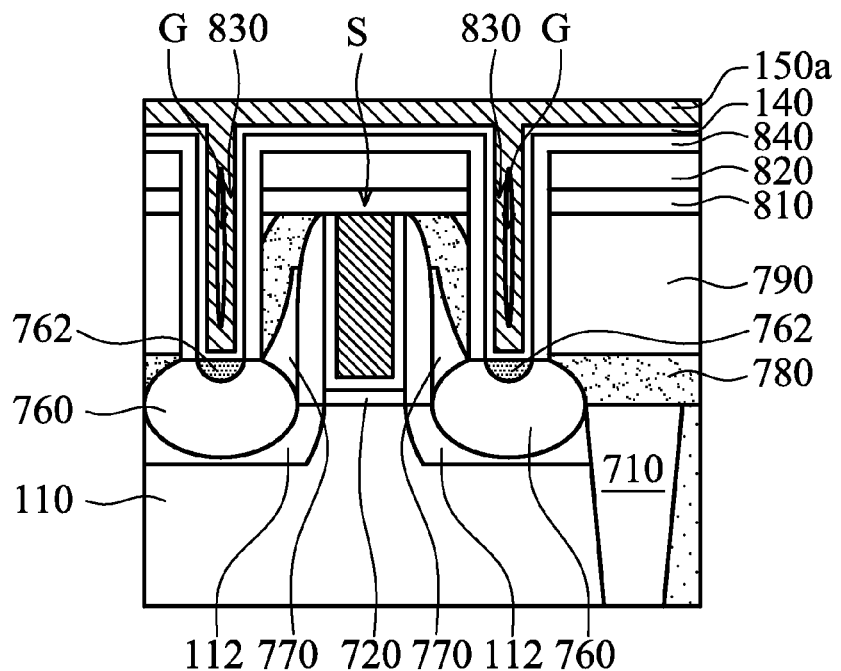

As shown in FIG. 7B, a seed layer 140 is formed over the DSL layer 840 and the metal silicide regions 762, in accordance with some embodiments. As shown in FIG. 7C, a first conductive material layer 150a is formed over the seed layer 140, in accordance with some embodiments. In some embodiments, there are voids G formed in the first conductive material layer 150a. The voids G are positioned in the contact openings 830, in accordance with some embodiments.

Figure 7D:
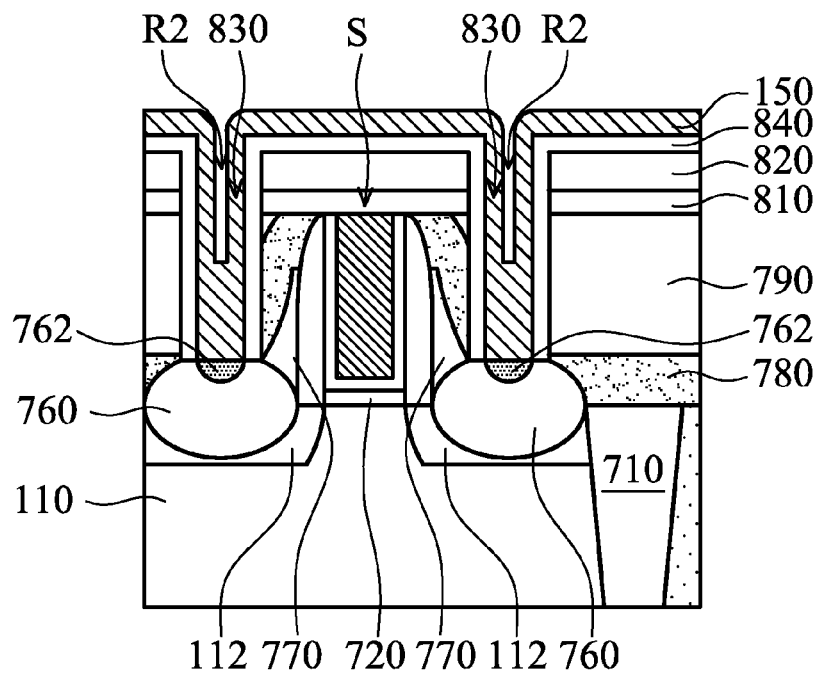

As shown in FIG. 7D, a reflow process is performed to convert the first conductive material layer 150a into a first conductive layer 150, in accordance with some embodiments. The first conductive layer 150 has recesses R2 in the contact openings 830, in accordance with some embodiments.

In some embodiments, the reflow process further melts the seed layer 140. Therefore, the melted seed layer 140 is mixed with the melted first conductive material layer 150a to form the first conductive layer 150, in accordance with some embodiments. In some other embodiments (not shown), the reflow process does not melt the seed layer 140.

Figure 7E:
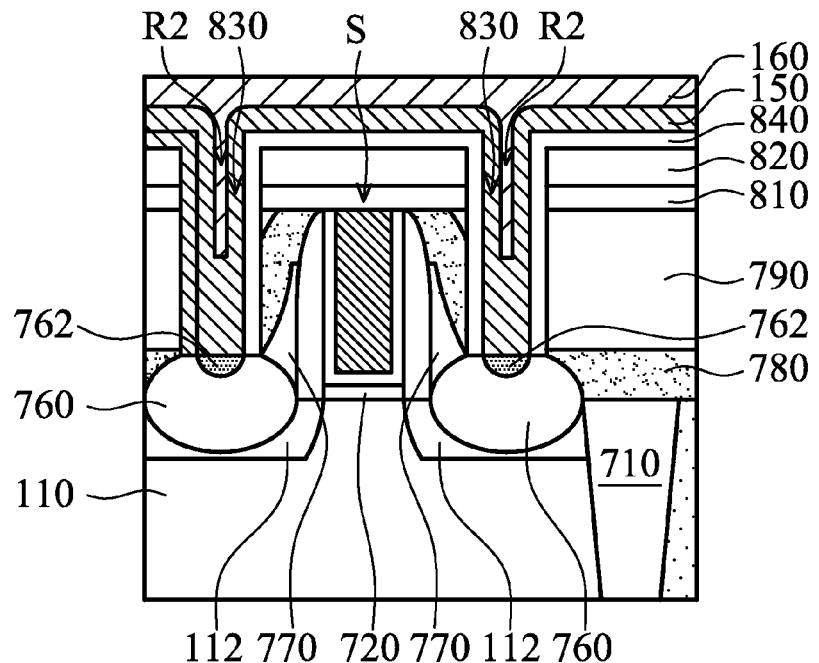

As shown in FIG. 7E, a second conductive layer 160 is formed over the first conductive layer 150 to fill the recesses R2, in accordance with some embodiments. The second conductive layer 160 is formed by an electroplating process or an electroless plating process. In some embodiments, the first conductive layer 150 and the second conductive layer 160 include the same material (e.g., cobalt).

Figure 7F:
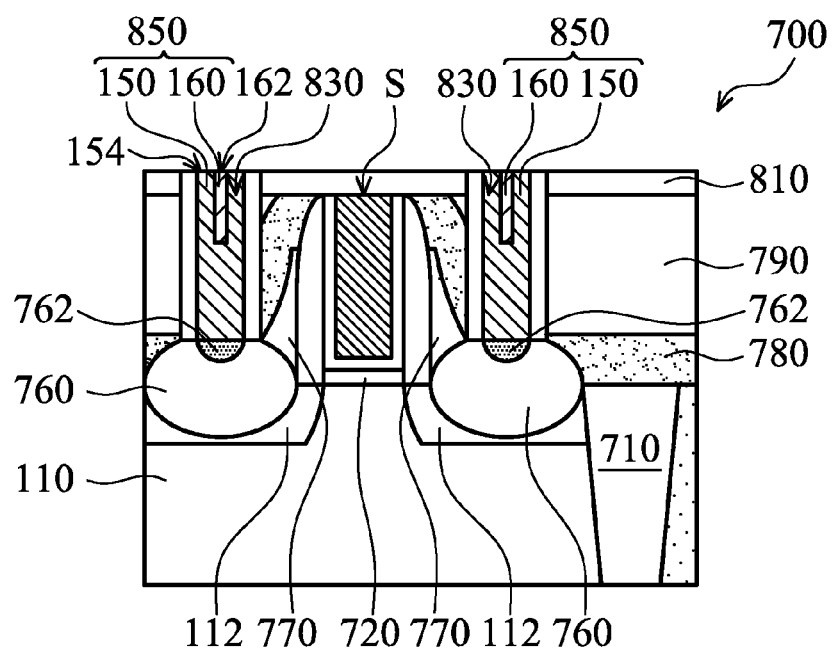

As shown in FIG. 7F, the protective layer 820, portions of the first conductive layer 150, the second conductive layer 160, and the DSL layer 840 outside of the contact openings 830 are removed, in accordance with some embodiments. The removal process includes a planarization process (e.g., a chemical mechanical polishing process), in accordance with some embodiments.

After the planarization process, a top surface 162 of the second conductive layer 160 is substantially aligned with a top surface 154 of the first conductive layer 150, in accordance with some embodiments. The second conductive layer 160 and the first conductive layer 150 together form contact structures 850, in accordance with some embodiments. The contact structures 850 pass through the stop layer 810, the dielectric layer 790, and the contact etch stop layer 780. The contact structures 850 are electrically connected with the doped regions 112 through the stressors 760, in accordance with some embodiments.

In accordance with some embodiments, semiconductor device structures and methods for forming the same are provided. The methods (for forming the semiconductor device structure) form a conductive structure in a first recess in a dielectric layer to fill the first recess. The formation of the conductive structure includes forming a first conductive layer with a second recess in the first recess; and forming a second conductive layer in the second recess by an electroplating process or an electroless plating process. Therefore, even if the second recess is a narrow recess, the second conductive layer may fill the second recess as long as the electrolyte used in the plating process is able to flow into the second recess. The methods may improve the yield and the reliability of the conductive structure.

In accordance with some embodiments, a semiconductor device structure is provided. The semiconductor device structure includes a semiconductor substrate. The semiconductor device structure includes a dielectric layer positioned on the semiconductor substrate. The dielectric layer has a first recess. The semiconductor device structure includes a conductive structure filling the first recess. The conductive structure includes a first conductive layer and a second conductive layer. The first conductive layer is positioned over an inner wall and a bottom of the first recess. The first conductive layer has a second recess in the first recess. The second conductive layer fills the second recess. The first conductive layer and the second conductive layer include cobalt. The second conductive layer further includes at least one of sulfur, chlorine, boron, phosphorus, or nitrogen.

In accordance with some embodiments, a semiconductor device structure is provided. The semiconductor device structure includes a semiconductor substrate. The semiconductor device structure includes a dielectric layer positioned on the semiconductor substrate. The dielectric layer has a first recess. The semiconductor device structure includes a conductive structure filling the first recess. The conductive structure includes a first conductive layer and a second conductive layer. The first conductive layer is positioned over an inner wall and a bottom of the first recess. The first conductive layer has a second recess in the first recess. The second conductive layer fills the second recess. The first conductive layer and the second conductive layer include cobalt. The second conductive layer includes about 0.1 to about 2 atomic percent of at least one of carbon or oxygen.

In accordance with some embodiments, a method for forming a semiconductor device structure is provided. The method includes forming a dielectric layer over a semiconductor substrate. The dielectric layer has a first recess. The method includes forming a first conductive layer over an inner wall and a bottom of the first recess. The first conductive layer has a second recess in the first recess. The method includes performing an electroplating process or an electroless plating process to form a second conductive layer over the first conductive layer so as to fill the second recess. The first conductive layer and the second conductive layer include cobalt.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a dielectric layer positioned above the semiconductor substrate, wherein the dielectric layer has an inner wall surrounding and defining a first recess; and
   a conductive structure filling the first recess, wherein the conductive structure comprises:
   a first conductive layer positioned over the inner wall of the dielectric layer and a bottom of the first recess, wherein the first conductive layer has an inner wall surrounding and defining a second recess at least partially in the first recess, and a top of the inner wall of the first conductive layer is substantially aligned with or above a top of the dielectric layer; and
   a second conductive layer filling the second recess, wherein the first conductive layer and the second conductive layer comprise cobalt, and the second conductive layer further comprises at least one of sulfur, chlorine, boron, phosphorus, or nitrogen.

2. The semiconductor device structure as claimed in claim 1, wherein the second conductive layer comprises about 0.00001 to about 1 atomic percent of the at least one of sulfur, chlorine, boron, phosphorus, or nitrogen.

3. The semiconductor device structure as claimed in claim 1, wherein the second conductive layer comprises about 0.1 to about 2 atomic percent of at least one of carbon or oxygen.

4. The semiconductor device structure as claimed in claim 1, wherein the second conductive layer comprises about 50 to about 97 atomic percent of cobalt.

5. The semiconductor device structure as claimed in claim 1, wherein the first recess comprises a trench, and the conductive structure comprises a conductive wire.

6. The semiconductor device structure as claimed in claim 5, wherein the first recess further comprises a via hole connected with the trench, and the conductive structure further comprises an interconnect structure connected with the conductive wire.

7. The semiconductor device structure as claimed in claim 1, wherein the first recess comprises a via hole, and the conductive structure comprises an interconnect structure.

8. The semiconductor device structure as claimed in claim 1, further comprising:
   a gate stack positioned over the semiconductor substrate and between a source region and a drain region of the semiconductor substrate, wherein the gate stack is embedded in the dielectric layer, and the conductive structure passes through the dielectric layer to electrically connect with the source region or the drain region.

9. A semiconductor device structure, comprising:
   a semiconductor substrate;
   a dielectric layer positioned above the semiconductor substrate, wherein the dielectric layer has an inner wall surrounding and defining a first recess; and
   a conductive structure filling the first recess, wherein the conductive structure comprises:
   a first conductive layer positioned over the inner wall of the dielectric layer and a bottom of the first recess, wherein the first conductive layer has an inner wall surrounding and defining a second recess at least partially in the first recess, and a top of the inner wall of the first conductive layer is substantially aligned with or above a top of the dielectric layer; and
   a second conductive layer filling the second recess, wherein the first conductive layer and the second conductive layer comprise cobalt, and the second conductive layer comprises about 0.1 to about 2 atomic percent of at least one of carbon or oxygen.

10. The semiconductor device structure as claimed in claim 9, further comprising:
    a barrier layer deposited over the inner wall of the dielectric layer and the bottom of the first recess, wherein the barrier layer is positioned between the first conductive layer and the dielectric layer.

11. The semiconductor device structure as claimed in claim 10, wherein the barrier layer comprises nitride or metal.

12. The semiconductor device structure as claimed in claim 9, wherein the first recess has a width ranging from about 5 nm to about 100 nm.

13. The semiconductor device structure as claimed in claim 9, wherein the first recess comprises a trench, and the conductive structure comprises a conductive wire.

14. The semiconductor device structure as claimed in claim 13, wherein the first recess further comprises a via hole connected with the trench, and the conductive structure further comprises an interconnect structure connected with the conductive wire.

15. The semiconductor device structure as claimed in claim 9, further comprising:
    a gate stack positioned over the semiconductor substrate and between a source region and a drain region of the semiconductor substrate, wherein the gate stack is embedded in the dielectric layer, and the conductive structure passes through the dielectric layer to electrically connect with the source region or the drain region.

16. The semiconductor device structure as claimed in claim 1, further comprising:
    a barrier layer deposited over the inner wall of the dielectric layer and the bottom of the first recess, wherein the barrier layer is positioned between the first conductive layer and the dielectric layer.

17. The semiconductor device structure as claimed in claim 16, wherein the barrier layer comprises nitride or metal.

18. The semiconductor device structure as claimed in claim 6, wherein the trench has a width ranging from about 5 nm to about 100 nm, and the via hole has a width less than the width of the trench.

19. The semiconductor device structure as claimed in claim 1, wherein the second recess has a width ranging from about 1 nm to about 50 nm.

20. The semiconductor device structure as claimed in claim 9, wherein the second recess has a width ranging from about 1 nm to about 50 nm.

* * * * *